US007737470B2

(12) United States Patent
Losehand

(10) Patent No.: US 7,737,470 B2
(45) Date of Patent: Jun. 15, 2010

(54) HIGH-FREQUENCY DIODE

(75) Inventor: Reinhard Losehand, München (DE)

(73) Assignee: Infineon Technologies AG, Munich (DE)

( * ) Notice: Subject to any disclaimer, the term of this patent is extended or adjusted under 35 U.S.C. 154(b) by 726 days.

(21) Appl. No.: 10/949,940

(22) Filed: Sep. 24, 2004

(65) Prior Publication Data

US 2005/0110046 A1 May 26, 2005

(51) Int. Cl.
*H01L 29/73* (2006.01)
(52) U.S. Cl. ..................................... 257/199
(58) Field of Classification Search ................ 257/199, 257/77, 478, 604, 119, E29.171, 47, 197, 257/273, 351, 458, 656, 205, 163–166, 697, 257/192, 194, 200, 201, 190, 189, E33.046
See application file for complete search history.

(56) References Cited

U.S. PATENT DOCUMENTS

| 2,806,983 | A | * | 9/1957 | Hall | 257/566 |
| 3,019,352 | A | * | 1/1962 | Wertwijn | 327/534 |
| 3,510,735 | A | * | 5/1970 | Gene | 257/541 |
| 3,553,536 | A | * | 1/1971 | Neilson | 257/610 |
| 5,243,199 | A | * | 9/1993 | Shiomi et al. | 257/77 |
| 5,969,402 | A | * | 10/1999 | Rynne | 257/508 |
| 6,891,250 | B1 | * | 5/2005 | Sakamoto | 257/592 |
| 6,911,715 | B2 | * | 6/2005 | Park et al. | 257/565 |
| 2006/0267045 | A1 | * | 11/2006 | Ogura et al. | 257/192 |

FOREIGN PATENT DOCUMENTS

| EP | 0 090 722 B1 | 11/1985 |
| EP | 0440344 A1 | 8/1991 |
| JP | 2000-164763 | 6/2000 |
| JP | 2002-076009 A | 3/2002 |

* cited by examiner

*Primary Examiner*—Dao H Nguyen
*Assistant Examiner*—Tram H Nguyen
(74) *Attorney, Agent, or Firm*—Maginot, Moore & Beck

(57) ABSTRACT

A high-frequency diode has a first semiconductor area with a first conductivity type as well as a barrier area adjacent to the first semiconductor area, which has a second conductivity type, which differs from the first conductivity type. Further, the high-frequency diode has a second semiconductor area adjacent to the barrier area, which has the second conductivity type and a dopant concentration which is lower than the dopant concentration of the barrier are or equal to zero. Further, the high-frequency diode has a third semiconductor area adjacent to the second semiconductor area, which has the same conductivity type and a higher dopant concentration than the barrier area. Through such a structure it is possible to provide a high-frequency diode with short switching times and low bias.

13 Claims, 4 Drawing Sheets

HIGH-FREQUENCY DIODE

CROSS-REFERENCE TO RELATED APPLICATION

This application claims priority from German Patent Application No. 10344609.5, which was filed on Sep. 25, 2003 and is incorporated herein by reference in its entirety.

BACKGROUND OF THE INVENTION

1. Field of the Invention

The present invention refers generally to a high-frequency diode and particularly to a high-frequency diode requiring a lower bias in the blocking state than high-frequency diodes according to the prior art.

2. Description of the Related Art

Silicon high-frequency switches are often realized with PIN diodes. This results from the structure of the PIN diodes favorable for high-frequency technical applications, as it is, for example, shown in FIG. 3. Thereby, the PIN diode comprises a half-isolating substrate 300, into which a well 302 is embedded, which has an n-doped semiconductor material with a high $n^+$ dopant concentration compared to the half-isolating substrate 300 (buried layer n-cathode). Further, a second semiconductor area is disposed in a central area 304 of a surface 306 of the well 302, which comprises an n-doped semiconductor material with a lower dopant concentration than the semi-isolating substrate 300 (n intrinsic zone, I-zone). Further, a third semiconductor area 312 is disposed on a surface 310 of the second semiconductor area 308, which comprises a p-doped semiconductor material with a high $p^+$-doped concentration (p-anode). The third semiconductor area 312 and the second semiconductor area 308 are bounded on the sides by a boundary structure 314, wherein the boundary structure 314 further extends into the first semiconductor area 302. The boundary structure 314 is formed by an oxide filled isolation trench (oxide filled trench). A filling material 316 is disposed on the side of the boundary structure 314 opposing the second semiconductor area 308 and the third semiconductor area 312, which has a recess 320 in the marginal area 318. Further, a contacting structure 322 is disposed in the recess 320, which comprises sub-areas 324 of electrically conductive material and sub-areas 326 of electrically isolating material. The electrically conductive sub-areas 324 are further electrically conductively connected to the first semiconductor area 302, so that the first semiconductor area 302 can be contacted electrically conductively from a contact point 328 via the contacting structure 322. Further, a cover layer 330 is disposed at least partly on the boundary structure 314 as well as the filling material 316.

The favorable characteristics by which a PIN diode is optimally suited as a high-frequency switch, are particularly given by the weakly n-doped second semiconductor area 308, which is disposed between the highly n-doped first semiconductor area 302 and the highly p-doped third semiconductor area 312. When applying a blocking voltage, a space charge region forms between a pn-junction, wherein the space charge region has a space charge region width in the respectively differently doped semiconductor areas which depends on the dopant concentration in the respective semiconductor area. Since, when applying a blocking voltage between the first semiconductor area 302 and the third semiconductor area 312 between the first semiconductor area 302 and the second semiconductor area 308, a space charge region results which has a large width in the second semiconductor area 308 due to the low charge carrier density, the PIN diode illustrated in FIG. 3 thus forms a low blocking capacity due to the broad space charge region between the first semiconductor area 302 and the second semiconductor area 308, whereby the favorable blocking characteristics of the PIN diodes as high-frequency switch are effected.

WLAN systems require an antenna switch, which can be used for two frequency bands at 2.5 and 5.5 GHz, has short switching times of 80 ns and copes with powers of up to 1 W. The PIN diode illustrated in FIG. 3 is suitable both for realizing integrated circuits and discrete flip-chip diodes. Classical diode structures with wire bonding and backside contact are not suitable any more for the high frequencies. Thus, a buried-layer cathode 302 with trench sinker in the shape of the illustrated contacting structure 322 is used, which leads the cathode contact towards the top. Further, the diode is surrounded by a trench in the form of the boundary structure 314, which keeps the injection volume small and thus the switching time short. To keep the injection volume small and thus the switching times short, a PIN diode according to FIG. 3 has additionally a thickness 332 of merely 7 μm and a width 334 of merely 50 μm. Further, the contacting structure 322 has also sub-areas of an isolating material, whereby the volume of the conductive material 326 can be reduced and thus the shortening of the switching time of the PIN diode is possible by reducing the number of charge carriers (for example electrons) to be moved.

The diode does fulfill the above requirement, however, it is disadvantageous that it requires a high bias voltage of almost the value of the high-frequency amplitude, which is 10 V at 1 Watt, during blocking operation with 1 W power level. In other words, for blocking the current flow, the PIN diode requires a bias which corresponds to approximately the height of the high-frequency amplitude which is to be blocked. Apart from a time voltage curve 410 and a time current curve 412, the oscillogram in the lower sub-image of FIG. 4 shows also a DC voltage level of 8 V, an amplitude of the fundamental wave of 10 V and level distances of 64, 68 and 74 dB for the H2, H3 and H4 harmonics. A simulation of the blocking behavior (see FIG. 4, lower sub-image) shows that with 8 V bias the forward current is suppressed so far that a sufficiently large harmonic distance of 60 dB is kept.

The left upper sub-image of FIG. 4 shows a doping profile, which represents a hole concentration 420 of the p-anode at the left margin as well as an electron concentration 422 of the n-cathode (buried layer n-cathode) at the right margin. Further, the doping profile shows that charge carriers, i.e. electrons and/or holes, already enter the second semiconductor area (I-zone), wherein the second semiconductor area is represented in the central area of the doping profile. The current flowing thereby is too small to cause a mentionable isolation deterioration and to affect the harmonic behavior. In the right upper sub-image, the potential curve in the third, second and first semiconductor area as well as in the barrier area is illustrated at different operating times.

One possible process for reducing the required bias is to make the I-zone of the PIN diode long and thus to reduce the turn-on speed of the PIN diode so far that a time period of a positive half-wave of a high-frequency modulation is not sufficient for the PIN diode to turn on. In other words, the thickness 332 of the second semiconductor area 308 illustrated in FIG. 3 is enlarged such that the charge carriers cannot drift through the second semiconductor area 308 during the positive half-wave of the high-frequency modulation and thus switching through of the PIN diode is prevented. Thus, the thickness 332 of the second semiconductor area 308 is dependent on the operating frequency of the PIN diode.

However, it is one disadvantage of this method that the switching time of the PIN diode switch will become longer.

SUMMARY OF THE INVENTION

It is the object of the present invention to provide a high-frequency switch with low switching times, a low bias as well as a switching possibility for high powers.

In accordance with a first aspect, the present invention provides a high-frequency diode, having a first semiconductor area having a first conductivity type; a barrier area adjacent to the first semiconductor area having a second conductivity type, which differs from the first conductivity type; a second semiconductor area adjacent to the barrier area, which has the second conductivity type and a dopant concentration, which is lower than a dopant concentration of the barrier area or equal to zero; and a third semiconductor area adjacent to the second semiconductor area, which has a second conductivity type and a higher dopant concentration than the barrier area.

In accordance with a second aspect, the present invention provides a high-frequency circuit, having a switch with a high-frequency diode according to claim 1, wherein the high-frequency diode comprises an anode and a cathode; a control means, which is formed to close or open the switch depending on a control signal, wherein the control means is further formed to apply a positive bias between the cathode and the anode of the high-frequency diode when opening the switch.

The present invention is based on the knowledge that by inserting a barrier area between the first semiconductor area and the second semiconductor area of the high-frequency diode, a short time flowing of electrons during switching from blocking polarity to flow polarity can be prevented. A reason therefore is that a space charge region is formed during blocking polarity of the diode, which remains for several ns when switching from blocking polarity to flow polarity of the diode. The potential building up in the space charge region thus forms an effective potential barrier against electron emission for a short time interval after switching the high-frequency diode from blocking polarity to flow polarity. Thereby, the turn-on procedure is not avoided but delayed.

The inventive solution provides the advantage that by forming the barrier area between the first semiconductor area and the second semiconductor area, a reduction of the bias can also be obtained with lower thicknesses of the second semiconductor area (i.e. with shorter I-zone widths). Thus, the switching time of the high-frequency diode switch can be kept short. Further, reduction of the switching behavior with regard to the high-frequency powers to be switched is not to be expected.

According to a preferred embodiment of the present invention, the material with the first conductivity type comprises an n-doped semiconductor material, and the material with the second conductivity type a p-doped semiconductor material.

Preferably, the barrier area has a dopant concentration between $10^{15}$ and $10^{18}$ dopant atoms per $cm^3$.

According to a further preferred embodiment of the present invention, the barrier area has a dopant concentration between $10^{16}$ and $10^{17}$ dopant atoms per $cm^3$.

According to a further aspect of the present invention, the dopant concentration of the second semiconductor area is smaller than $10^{14}$ dopant atoms per $cm^3$ or equal to 0.

Preferably, the first and third semiconductor area of the high-frequency diode has a dopant concentration, which is larger than $10^{19}$ dopant atoms per $cm^3$.

According to a further preferred embodiment of the present invention, the barrier area comprises a thickness between the first semiconductor area and the second semiconductor area, which lies within a value range between 0.2 μm and 0.8 μm.

According to a further preferred embodiment of the present invention, the thickness of the barrier area lies in a range within 0.4 μm and 0.6 μm.

According to a further preferred embodiment of the present invention, the second semiconductor area has a thickness between the barrier area and the third semiconductor area, which lies between a value range between 4 μm and 10 μm.

Preferably, the thickness of the second semiconductor area lies in a value range between 5 μm and 8 μm.

According to a further aspect of the present invention, the barrier area, the second semiconductor area and the third semiconductor area have a lateral extension, which lies within a value range between 20 μm and 100 μm.

Preferably, the lateral extension lies within a value range between 40 μm and 60 μm.

According to a further preferred embodiment of the present invention, a boundary structure is disposed on the side of the barrier area, the second semiconductor area and the third semiconductor area, which defines the lateral extension of the barrier area, the second semiconductor area and the third semiconductor area.

Preferably, the boundary structure comprises an isolating material.

According to a further aspect of the present invention, the first semiconductor area can be electrically conductively contacted by a contact point of a contacting structure, wherein the contact point is disposed higher over the first semiconductor area than an interface between the second and the third semiconductor area.

Preferably, the contacting structure comprises at least one sub-structure of an isolating material.

According to a further preferred embodiment of the present invention, the first semiconductor area is disposed on a substrate, which comprises a semi-isolating material.

According to a further aspect of the present invention, the inventive high-frequency diode is part of a switch of a high-frequency circuit, wherein the high-frequency diode has an anode and a cathode, wherein the high-frequency circuit has a control means, which is formed to close or to open the switch depending on a control signal, wherein the control means is further formed to apply a positive bias between the cathode and the anode of the high-frequency diode when opening the switch.

According to a further preferred embodiment of the present invention, a switch input of the switch can be coupled to an output voltage of a high-frequency source, wherein a voltage signal can be supplied from the high-frequency source, which has a high-frequency voltage amplitude and wherein the positive bias is smaller or equal to half the high-frequency voltage amplitude.

According to a further preferred embodiment, the positive bias is smaller or equal to one third of the high-frequency voltage amplitude.

BRIEF DESCRIPTION OF THE DRAWINGS

These and other objects and features of the present invention will become clear from the following description taken in conjunction with the accompanying drawings, in which.

DESCRIPTION OF THE PREFERRED EMBODIMENTS

In the following description of the preferred embodiment of the present invention, the same reference numbers are used for the similar elements illustrated in the different figures.

Figure 1:
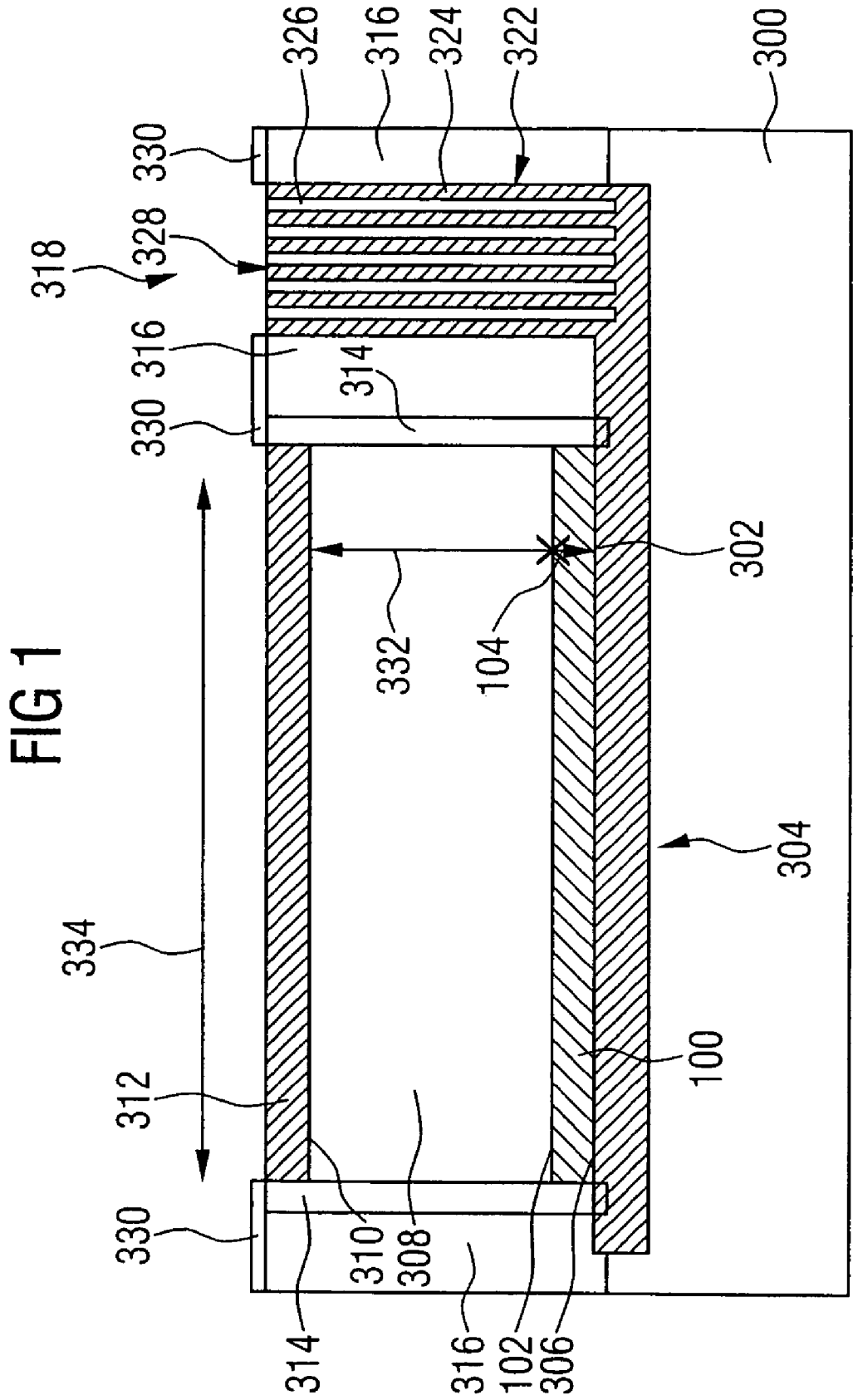
FIG. 1 is a preferred embodiment of an inventive high-frequency diode in a cross-sectional view.
Figure 3:
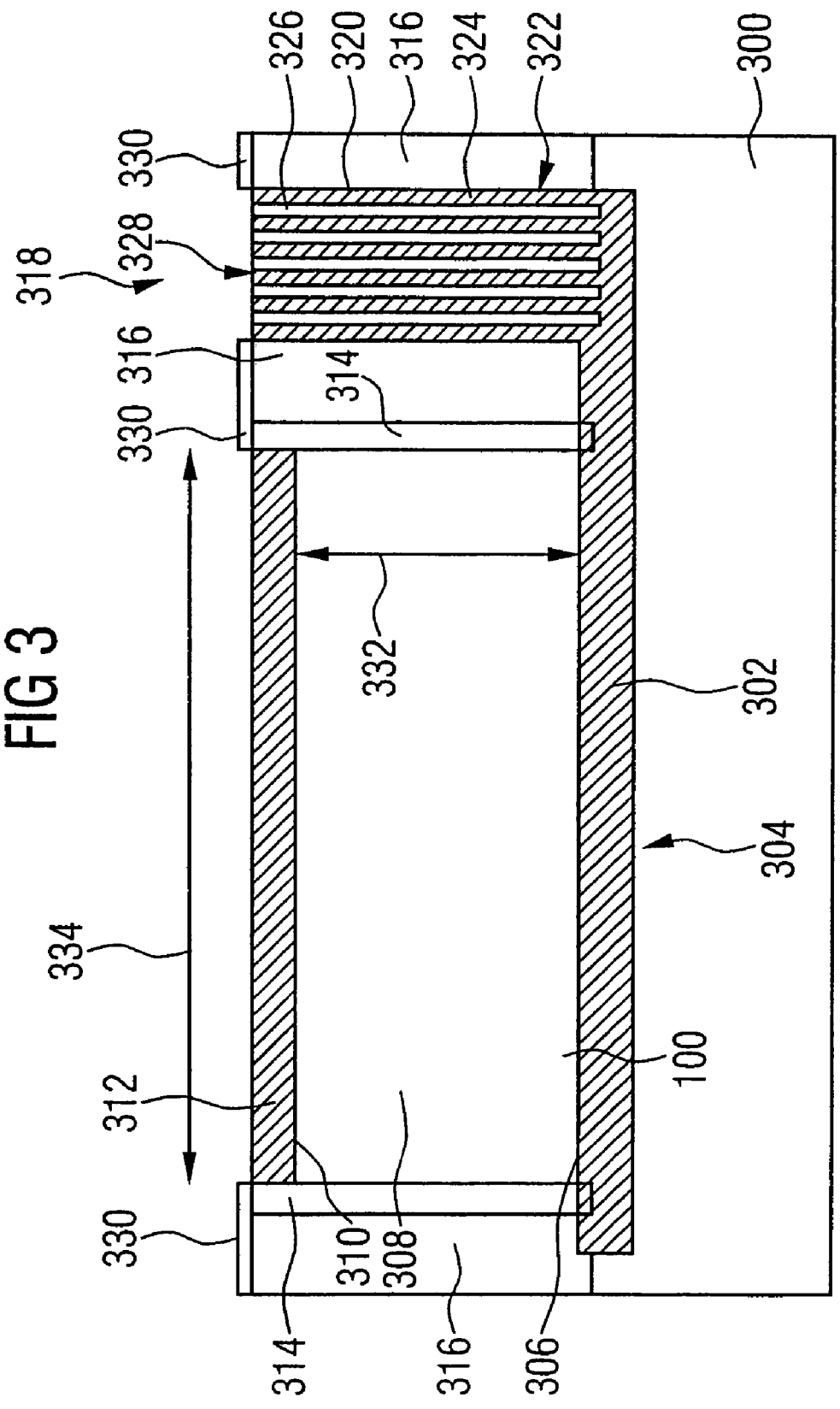
FIG. 3 is a cross-sectional view of a high-frequency diode according to the prior art.

FIG. 1 shows a preferred embodiment of the inventive high-frequency diode, which is structured similar to the conventional high-frequency diode illustrated in FIG. 3. Contrary to the high-frequency diode illustrated in FIG. 3, the inventive high-frequency diode has a barrier area 100, which is disposed in the central area 304 on the surface 306 of the first semiconductor area 302. Further, the second semiconductor area 308 is disposed on a surface 102 of the barrier area. Thereby, the structure illustrated in FIG. 1 results, where the barrier area 100 is disposed between the first semiconductor area 302 and the second semiconductor area 308. The barrier area 100 (the injection barrier) consists preferably of a p-doped semiconductor zone with an acceptor concentration of about $10^{16}$ dopant atoms per $cm^3$, wherein the barrier area 100 has a thickness 104 of about 0.5 µm. The barrier area 100 (the electron emission barrier) is thus built up by a weakly p-doped layer adjacent to the highly n-doped cathode area of the first semiconductor area 302 of the inventive high-frequency diode. The $p^+In^+$ dopant profile of a conventional PIN diode is thus replaced by a $p^+Ip^-n^+$ dopant profile of the inventive high-frequency diode. Thereby it is prevented that electrons can reach the second semiconductor area 308 (I area) of the inventive high-frequency diode shortly after switching from the blocking polarity to the flow polarity, i.e. in the initial flow phase. Holes, however, can enter the second semiconductor area 308 but lead only to low currents due to the low hole movability.

In the preferred embodiment of the present invention, the thickness 332 of the second semiconductor area 308 is 6.5 µm. Depending on the intended field of application of the inventive high-frequency diode as high-frequency switch, the thickness 332 of the second semiconductor area 308 can lie in a value range of, for example, 4 µm and 10 µm. For a field of application of the inventive high-frequency diode in the frequency bands of 2.5 and 5.5 GHz, the value range of the thickness 332 of the second semiconductor area 308 is preferably chosen between 5 µm and 8 µm. For an optimum adaptation of the injection volume, further, the width 334 of the barrier area 100, the second semiconductor area 308 as well as the third semiconductor area 312 can be chosen within a value range of 20 µm to 100 µm. For the named field of application in the two frequency bands, preferably, a width 334, i.e. a lateral extension of the barrier area 100, the second semiconductor area 308 as well as the third semiconductor area 312 is preferably chosen within a value range of 40 µm to 60 µm.

It should be noted that the i area of the PIN diode can be weakly n-doped or weakly p-doped. Thus, the doping type is arbitrary, as long as this area has a high impedance. Here, the i area can have the same type as the substrate. Since weakly p-doped isolating substrates are more favorable than n-doped substrates with regard to isolation properties, p-substrates are preferred for the invention, although leaking currents due to a too weak isolation are unproblematic, particularly for high-frequency diodes.

Figure 2:
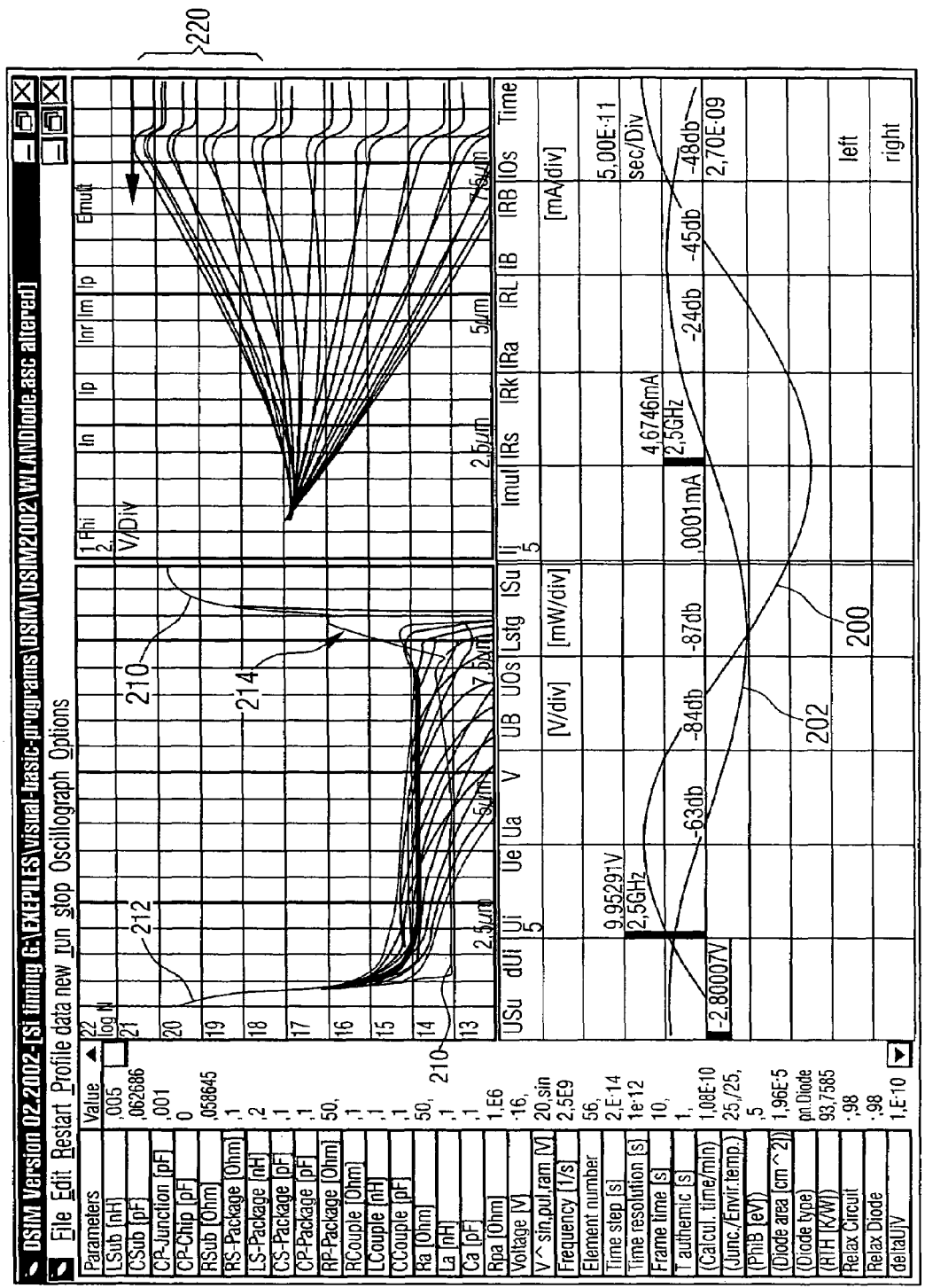
FIG. 2 is a representation of several simulation diagrams of the inventive high-frequency diode.

FIG. 2 shows several simulation diagrams, which represent the behavior of the inventive high-frequency diode according to the preferred embodiment. In the lower sub-image, the voltage curve 200 and the current curve 202, which result when providing the inventive high-frequency diode with a high-frequency signal, are plotted across time. Further, it can be seen from the lower sub-image of FIG. 2 that the bias can be lowered to a common VCC level of 2.8 V. Again, the amplitude of the high-frequency signal is approximately 10V. The harmonics levels are also far enough away in this case: from 63, 84 and 87 dB for the H2, H3 and H4 harmonics. Again, the left upper sub-image of FIG. 2 shows the doping profile with an electron concentration 210 and a hole concentration 212, plotted across the extension of the second semiconductor area and the barrier area, which are illustrated on the abscissa starting from the left margin of the diagram. It can be seen from the doping profile that the hole concentration 212 extends into the second semiconductor area, which is disposed on the abscissa mainly between the range of 1 µm to 7.5 µm, starting from the third semiconductor area illustrated at the left margin of the image. Compared with this, it can be seen from the left upper sub-image in FIG. 2 that the electron concentration 210 first falls heavily starting from the first semiconductor area illustrated at the right margin of the diagram in the direction towards the second semiconductor area (area 214), which can be explained by the p-doping of the barrier area. Further, in the second semiconductor area, which is disposed between the abscissa values of 1 µm to 7.5 µm, the electron concentration 210 assumes a concentration, which lies below the hole concentration 212.

Thereby it can be seen that in the inventive high-frequency diode the injection of electrons from the first semiconductor area to the second semiconductor area is made more difficult and is briefly prevented, respectively, by inserting the barrier area.

Figure 4:
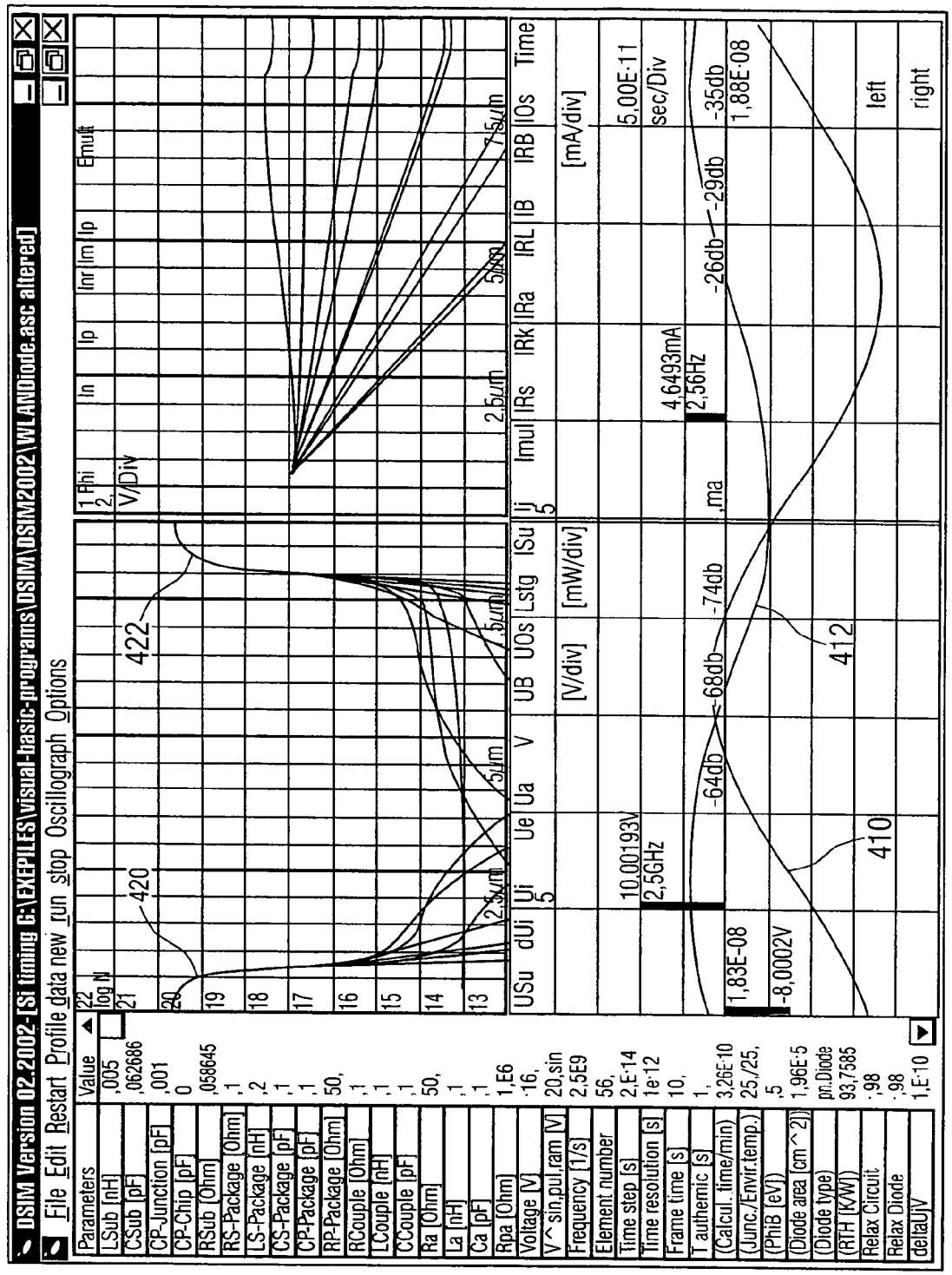
FIG. 4 is a representation of several simulation diagrams of the conventional high-frequency diode.

The exact potential curve is illustrated in FIG. 2 at the top right for the different phases of the high-frequency signal. Thereby, again on the abscissa, the extension of the second semiconductor area as well as the barrier area is illustrated starting from the third semiconductor area illustrated at the left margin of the diagram, while the voltage with regard to a potential of the third semiconductor area is plotted on the ordinate. Compared to the right upper sub-image in FIG. 4, which represents the potential curve of a conventional high-frequency diode, it can now be seen that at some times a significantly higher potential (see potential curves 220) can be observed in the inventive high-frequency diode compared to the conventional high-frequency diode. This results from the fact that the space charge region formed during blocking polarity in the diode remains for several nanoseconds at a transition to the flow polarity. During these nanoseconds, wherein the space charge region still exists, a reload procedure takes place, with an effect like a voltage opposing the flow polarity, whereby the effective potential barrier against an electron emission from the first semiconductor area to the second semiconductor area results. This opposing voltage can thus be seen in the potential diagram in the right upper sub-image of FIG. 2 by the potential curves 220.

It should further be noted that the described facts are simulation results.

Although a preferred embodiment of the present invention has been discussed in detail above, it is obvious that the present invention is not limited to this embodiment.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

REFERENCE NUMBER LIST 100 barrier area
102 surface of the barrier area
104 thickness of the barrier area
200 voltage curve in the inventive high-frequency diode
202 current curve in the inventive high-frequency diode
210 electron concentration in the inventive high-frequency diode
212 hole concentration in the inventive high-frequency diode
214 charge carrier concentration in the barrier area 100
220 potential curves caused by the space charge region in the high-frequency diode
300 substrate
302 first semiconductor area
304 central area of the first semiconductor area
306 surface of the first semiconductor area
308 second semiconductor area
310 surface of the second semiconductor area
312 third semiconductor area
314 boundary structure
316 filling material
318 margin area
320 recess in the margin area 318
322 contacting structure
324 conductive sub-area of the contacting structure 322
326 isolating sub-area of the contacting structure 322
328 contact point
330 cover layer
332 thickness of the second semiconductor area 308
334 lateral extension and width, respectively, of the barrier area 100, the second semiconductor area 308 and the third semiconductor area 312
410 voltage curve in the conventional high-frequency diode
412 current curve in the conventional high-frequency diode
420 hole concentration in the conventional high-frequency diode
422 electron concentration in the conventional high-frequency diode

What is claimed is:

1. A high-frequency diode, comprising:
a first semiconductor area having a first conductivity type;
a barrier area adjacent to the first semiconductor area having a second conductivity type, the second conductivity type different than the first conductivity type;
a second semiconductor area adjacent to the barrier area, the second semiconductor area having the second conductivity type and a dopant concentration of between zero and a first limit, the first limit being lower than a dopant concentration of the barrier area, wherein the barrier area has a dopant concentration between $10^{16}$ and $10^{17}$ dopant atoms per cm$^3$; and
a third semiconductor area adjacent to the second semiconductor area, the third semiconductor area having a second conductivity type and a higher dopant concentration than the barrier area, wherein the barrier area has a thickness within a value range between 0.2 μm and 0.8 μm, wherein the second semiconductor area has a thickness within a value range between 5 μm and 8 μm.

2. The high-frequency diode according to claim 1, wherein the first conductivity type comprises an n-conductivity type and the second conductivity type comprises a p-conductivity type.

3. The high-frequency diode according to claim 1, wherein the first limit comprises $10^{14}$.

4. The high-frequency diode according to claim 1, wherein the first semiconductor area has a dopant concentration of greater than $10^{19}$ dopant atoms per cm$^3$ and the dopant concentration of the third semiconductor area is higher than $10^{19}$ dopant atoms per cm$^3$.

5. The high-frequency diode according to claim 1, wherein the thickness of the barrier area is between 0.4 μm and 0.6 μm.

6. The high-frequency diode according to claim 1, wherein the barrier area, the second semiconductor area and the third semiconductor area have a lateral extension having a width, the width being within a value range between 20 μm and 100 μm.

7. The high-frequency diode according to claim 6, wherein the lateral extension width is within a value range between 40 μm and 60 μm.

8. The high-frequency diode according to claim 6, wherein a boundary structure is disposed adjacent a side of the barrier area, a side of the second semiconductor area and a side of the third semiconductor area, the boundary structure defining the lateral extension of the barrier area, the second semiconductor area and the third semiconductor area.

9. The high-frequency diode according to claim 8, wherein the boundary structure comprises an isolating material.

10. The high-frequency diode according to claim 9, wherein the first semiconductor area is configured to be electrically conductively contacted by a contact point of a contacting structure, wherein the contact point is disposed over the first semiconductor area at a level that is higher than an interface between the second semiconductor area and the third semiconductor area.

11. The high-frequency diode according to claim 10, wherein the contacting structure comprises at least one substructure of an isolating material.

12. The high-frequency diode according to claim 1, wherein the first semiconductor area is disposed on a substrate, the substrate comprising a semi-isolating material.

13. The high-frequency diode according to claim 1, wherein the high-frequency diode is a silicon high-frequency diode.

* * * * *